United States Patent
Eden et al.

(10) Patent No.: US 6,898,450 B2
(45) Date of Patent: *May 24, 2005

(54) HIGH TEMPERATURE SUPERCONDUCTING TUNABLE FILTER WITH AN ADJUSTABLE CAPACITANCE GAP

(75) Inventors: Richard C. Eden, Briarcliff, TX (US); Balam A. Willemsen, Ventura, CA (US); George L. Matthaei, Santa Barbara, CA (US)

(73) Assignee: Superconductor Technologies, Inc., Santa Barbara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/730,963

(22) Filed: Dec. 8, 2003

(65) Prior Publication Data

US 2004/0212457 A1 Oct. 28, 2004

Related U.S. Application Data (63) Continuation of application No. 10/023,575, filed on Dec. 17, 2001, now Pat. No. 6,662,029, which is a continuation of application No. 09/268,786, filed on Mar. 16, 1999, now Pat. No. 6,347,237.

(51) Int. Cl.[7] .......................... H03H 7/01; H01B 12/02
(52) U.S. Cl. .................. 505/210; 505/700; 505/866; 333/99 S; 333/185; 333/174
(58) Field of Search ............................. 333/99 S, 205, 333/185, 174; 505/210, 700, 701, 705, 866

(56) References Cited

U.S. PATENT DOCUMENTS

| 4,912,086 | A | | 3/1990 | Enz et al. |
|---|---|---|---|---|
| 5,099,162 | A | | 3/1992 | Sawada |
| 5,126,317 | A | | 6/1992 | Agarwala |
| 5,391,543 | A | | 2/1995 | Higaki et al. |
| 5,604,375 | A | | 2/1997 | Findikoglu et al. |
| 5,808,527 | A | | 9/1998 | De Los Santos |
| 5,968,876 | A | * | 10/1999 | Sochor ...................... 505/210 |
| 6,016,434 | A | | 1/2000 | Mizuno et al. |
| 6,049,726 | A | | 4/2000 | Gruenwald et al. |
| 6,347,237 | B1 | | 2/2002 | Eden et al. |
| 6,437,965 | B1 | | 8/2002 | Adkins et al. |
| 6,441,449 | B1 | | 8/2002 | Xu et al. |
| 6,662,029 | B2 | * | 12/2003 | Eden et al. ............ 333/99 S X |

FOREIGN PATENT DOCUMENTS

| GB | 2220526 B | 4/1992 |
|---|---|---|
| JP | 63028103 A | 2/1988 |
| JP | 01117648 A | 5/1989 |

OTHER PUBLICATIONS

Aminov, et al, "YBaCuO Disk Resonator Filters Operating at High Power", IEEE Transactions on Applied Superconductivity, 9, 2, Jun. 1999.

(Continued)

*Primary Examiner*—Benny T. Lee
(74) *Attorney, Agent, or Firm*—O'Melveny & Myers LLP (57) ABSTRACT

A tunable filter having a fixed substrate, a first and second plate comprising a high-temperature superconductor material on the fixed substrate, a movable substrate, a mechanical driver attached to the fixed substrate and the movable substrate, a floating plate comprising a high-temperature superconductor material on the fixed substrate wherein the floating plate, the first plate, and the second plate define a gap, and wherein the gap is varied by length changes in the mechanical driver is provided.

13 Claims, 7 Drawing Sheets

OTHER PUBLICATIONS

Hammond et al, "Epitaxial $Tl_2 CaBa_2 Cu_2 O_8$ Thin Films with Low 9.6 GHz Surface Resistance at High Power and Above 77K", Appl. Phys. Lett. 57, 8, Aug. 20, 1990, 825–827.

Low, "Modeling of Three–Layer Piezoelectric Biomorph Beam With Hysteresis", Journal of Microelectromechanical Systems, 4, 4, Dec. 1995, 230–237.

Mine, et al, "Characteristics of Mechanically Tunable Superconductive Resonators", Supercond. Sci. Technol. 15, 2002, 635–638.

Moeckley, et al, "Strontium Titanate Thin Films for Tunable $Yba_2Cu_{3\ 7}$ Microwave Filters", IEEE Transactions on Applied Superconductivity, 11, 1, Mar. 2001, 450–453.

Oates, et al, "Magnetically Tunable Superconducting Resonators and Filters", IEEE Transactions on Applied Superconductivity, 9, 2, Jun. 1999, 4170–4175.

Soares, et al, "Optical Switching of HTS Band Reject Resonators", IEEE Transactions on Applied Superconductivity, 5, 2, Jun. 1995, 2276–2278.

Terashima, et al, "2GH Tunable Superconducting Band–Pass Filter Using a Piezoelectric Bender", Physica C, 366, 2002, 183–189.

Xu, et al, "Active Tuning of High Frequency Resonators and Filters", IEEE Transactions on Applied Superconductivity, 11, 1, Mar. 2001, 353–356.

* cited by examiner

(a)   $d \approx \frac{\lambda_0}{2}$ for $f \approx f_0$

$\approx Z_{in}$ for $f \approx f_0$

HIGH TEMPERATURE SUPERCONDUCTING TUNABLE FILTER WITH AN ADJUSTABLE CAPACITANCE GAP

CROSS-REFERENCE TO RELATED APPLICATIONS

This is a continuation application of application Ser. No. 10/023,575, filed on Dec. 17, 2001, and issuing as U.S. Pat. No. 6,662,029 on Dec. 9, 2003, which is a continuation application of application Ser. No. 09/268,786, filed on Mar. 16, 1999, and issued as U.S. Pat. No. 6,347,237 on Feb. 12, 2002, the disclosures of which are hereby incorporated by reference.

FIELD OF THE INVENTION

This invention relates to a high temperature superconductor (HTS) tunable filter. More particularly, this invention relates to an HTS filter tunable by variation of a microelectromechanical capacitor.

BACKGROUND OF THE INVENTION

The need for a high-quality factor (Q), low insertion loss tunable filter pervades a wide range of microwave and RE applications, in both the military, e.g., RADAR, communications and electronic intelligence (ELINT), and the commercial fields such as in various communications applications, including cellular. Placing a sharply defined bandpass filter directly at the receiver antenna input will often eliminate various adverse effects resulting from strong interfering signals at frequencies near the desired signal frequency in such applications. Because of the location of the filter at the receiver antenna input, the insertion loss must be very low so as to not degrade the noise figure. In most filter technologies, achieving a low insertion loss requires a corresponding compromise in filter steepness or selectivity. In the present invention, the extremely low loss property of high-temperature superconductor (HTS) filter elements provides an attractive solution, achieving a very low insertion loss yet simultaneously allowing a high selectivity/steepness bandpass definition.

In many applications, particularly where frequency hopping is used, a receiver filter must be tunable to either to select a desired frequency or to trap an interfering signal frequency. Thus, the insertion of a linear tunable filter between the receiver antenna and the first nonlinear element (typically a low-noise amplifier or mixer) in the receiver offers, providing that the insertion loss is very low, substantial advantages in a wide range of RF and microwave systems. For example, in RADAR systems, high amplitude interfering signals, either from "friendly" nearby sources, or from jammers, can desensitize receivers or intermodulate with high-amplitude clutter signal levels to give false target indications. In high-density signal environments, RADAR warning systems frequently become completely unusable.

Both lumped element and distributed element filters suffer from these and other problems. For example, while distributed-element YIG-tuned filters have been used, the high level of insertion loss (usually greater than 10 dB) of suitable YIG filters necessitates their use on a "switch in when absolutely necessary" basis only, as the degradation to noise figure would generally be unacceptable. Lumped element filters also suffer problems. For a lumped element filter to be tunable, the filter requires either a tunable capacitor, or a tunable inductive element. The vast majority of RF tunable lumped element filters have used varactor diodes. Such a design amounts to using a tunable capacitor because varactor diodes, through changing the reverse bias voltage, vary the depletion thickness and hence the PN junction capacitance. While varactors are simple and robust, they have limited quality factors (Q), and suffer from the problem that the linear process that tunes them extends all the way to the signal frequency, so that high-amplitude signals create, through the resulting nonlinearities, undesirable intermodulation products, etc. The same problems of poor Q and high-frequency nonlinearities are anticipated for "tunable materials" such as ferroelectrics.

Consider the case of a conventional varactor diode. In a varactor, the motion of electrons accomplishes the tuning itself. As the reverse bias ($V_r$) on the junction of the varactor is changed, then in accordance with Poisson's Equation, the width of the PN junction depletion region changes which alters the capacitance of the junction ($C_j$). Because the tuning mechanism of varactors is electronic, the tuning speed is extremely fast. Unfortunately, this also leads to a serious associated disadvantage: limited dynamic range. Because the $C_j$ ($V_r$) relationship is nearly instantaneous in response, extending to changes in $V_r$ at the signal frequency itself, and because the signal (frequently in a resonantly magnified form) appears as a component of the junction bias voltage, $V_r$, the signal itself parametrically modulates the junction capacitance. If the signal amplitude across the varactor is very small in comparison to the dc bias, the effect is not too serious. Unfortunately, for high signal amplitudes, this parametric modulation of the capacitance can produce severe cross-modulation (IM) effects between different signals, as well as harmonic generation and other undesirable effects. While these signal-frequency varactor capacitance variations are the basis of useful devices such as parametric amplifiers, subharmonic oscillators, frequency multipliers, and many other useful microwave circuits, in the signal paths of conventional receivers they are an anathema. This inherent intermodulation or dynamic range problem will presumably extend to "tunable materials," such as ferroelectrics or other materials in which the change of dielectric constant ($\epsilon_r$) with applied electric field (E) is exploited to tune a circuit. As long as the $\epsilon_r$ (E) relationship applies out to the signal frequency, then the presence of the signal as a component of the E will lead to the same intermodulation problems that the varactors have.

In addition to the intermodulation/dynamic range problems of varactors, these conventional tuning devices also have serious limitations in Q, or tuning selectivity. Because the varactors operate by varying the depletion region width of a P-N junction, this means that at lower reverse biases (higher capacitances), there is a substantial amount of undepleted moderately-doped semiconductor material between the contacts and the junction that offers significant series resistance ($R_{ac}$) to ac current flow. Since the Q of a varactor of junction capacitance $C_j$ and series resistance $R_{ac}$ at the signal frequency f is given by $Q=1/(2 f C_j R_{ac})$, this means that the varactor Q values are limited, particularly at higher frequencies. For example, a typical commercial varactor might have $C_j=2.35$ pF with $R_{ac}=1.0$ Ω at $V_r=-4V$, or $C_j=1.70$ pF with $R_{ac}=0.82$ Ω at $V_r=-10V$, corresponding to Q values at f=1.0 GHz of Q=68 at $V_r=-4V$ or Q=114 at $V_r=-10V$ (or f=10.0 GHz values of Q=6.8 and Q=11.4, respectively). Considering that an interesting X-band (f=10 GHz) RADAR application might want a bandwidth of 20 MHz for the full width at half-maximum (FWHM), corresponding to a Q=500 quality factor, we see that available varactors have inadequate Q (too much loss) to meet such requirements. While the mechanisms are different, this will very likely apply to the use of ferroelectrics or other "tunable materials." A general characteristic of materials which exhibit the field-dependent dielectric constant nonlinearities (that makes them tunable) is that they exhibit substantial values of the imaginary part of the dielectric constant (or equivalently, loss tangent). This makes it unlikely that, as in varactors, these "tunable materials" will be capable of achieving high Q's, particularly at high signal frequencies.

An additional problem with both varactors and "tunable materials" for circuits with high values of Q is that these are basically two-terminal devices; that is, the dc tuning voltage must be applied between the same two electrodes to which the signal voltage is applied. The standard technique is to apply the dc tuning bias through a "bias tee"-like circuit designed to represent a high reactive impedance to the signal frequency to prevent loss of signal power out the bias port (as this would effectively reduce the Q). However, while the design of bias circuits that limit the loss of energy to a percent, or a fraction of a percent, even losses of a fraction of a percent are not nearly good enough for very high Q circuits (e.g., Q's in the $10^3$ to $>10^4$ range, as achievable with HTS resonators). It would be much easier to design such very high Q circuits using three-terminal, or preferably 4-terminal (two-port) variable capacitors in which the tuning voltage is applied to a completely different pair of electrodes from those across which the signal voltage is applied (with an inherent high degree of isolation between the signal and bias ports).

One new form of variable capacitor which avoids the problems of varactors or "tunable materials" approaches is the microelectromechanical (MEMS) variable capacitor such as that disclosed by U.S. Pat. No. 5,696,662. A number of MEMS variable capacitor device structures have been proposed, including elaborate lateral-motion interdigitated electrode capacitor structures. In the simple vertical motion, parallel plate form of this device, a thin layer of dielectric separating normal metal plates (or a normal metal plate from very heavily doped silicon) is etched out in processing to leave a very narrow gap between the plates. The thin top plate is suspended on four highly compliant thin beams which terminate on posts (regions under which the spacer dielectric has not been removed). The device is ordinarily operated in an evacuated package to allow substantial voltages to be applied across the narrow gap between plates without air breakdown (and to eliminate air effects on motion of the plate and noise). When a dc tuning voltage is applied between the plates, the small electrostatic attractive force, due to the high compliance of the support beams, causes substantial deflection of the movable plate toward the fixed plate or substrate, increasing the capacitance.

Because the change of capacitance, at least in the metal-to-metal plate version of the MEMS variable capacitor, is due entirely to mechanical motion of the plate (as opposed to "instantaneous" electronic motion effects as in varactors or "tunable materials"), the frequency response is limited by the plate mass to far below signal frequencies of interest. Consequently, these MEMS devices will be free of measurable intermodulation or harmonic distortion effects, or other dynamic range problems (up to the point where the combination of bias plus signal voltage across the narrow gap between plates begins to lead to nonlinear current leakage or breakdown effects).

In addition to their freedom from IM/dynamic range problems, normal metal plate MEMS variable capacitor structures offer the potential for substantially lower losses and higher Qs. While the simple parallel plate MEMS structure, which uses the top and bottom plates as the two capacitor electrodes, has a Q problem due to the skin effect resistance, $R_{ac}$, of the long narrow metal leads down the compliant beams supporting the movable plate, an alternative structure is possible which avoids this problem. If the top (movable) plate is made electrically "floating" (from a signal standpoint; it would still have a dc bias lead on it), and the fixed bottom plate split into two equal parts, these two split plates can be used as the signal leads to the MEMS variable capacitor. (The capacitance value is halved, of course, but the tuning range is preserved.) In this "floating plate" configuration, passage of ac current through the long narrow beam leads is avoided, allowing fairly high values of Q to be achieved, even with normal metal plates.

While this conventional MEMS variable capacitor structure is capable of improved Qs and avoids the intermodulation problems of varactors and "tunable materials," it has some potential problems of its own. Because only the relatively weak electrostatic attraction between plates is used to drive the plate motion to vary the capacitance, the plate support "spider" structure must be extremely compliant to allow adequate motion with supportable values of bias voltage. A highly compliant suspension of even a small plate mass may render the device subject to microphonics problems (showing up as fluctuations in capacitance induced by mechanical vibrations or environmental noise). Having the electric field which drives the plates directly in the (vacuum) signal dielectric gap may cause another problem. In order to achieve a high tuning range (in this case, the ratio of the capacitance with maximum dc bias applied to that with no dc bias), the ratio of the minimum plate separation to the zero-bias plate separation must be large (e.g., 10× would be desirable). Unfortunately, the minimum gap between the plates (maximum capacitance, and correspondingly, maximum danger of breakdown or "flash-over" failure between the plates) is achieved under exactly the wrong bias conditions: when the dc bias voltage is at a maximum.

Therefore, there is a need in the art for a new tunable filters incorporating MEMS-like HTS variable capacitor structure which offers extremely high Q wide tuning range, freedom from microphonics and breakdown problems, and fully isolated port tuning.

SUMMARY OF THE INVENTION

In one innovative aspect, the present invention comprises a tunable filter circuit including a variable capacitor. The variable capacitor comprises a fixed substrate on which is disposed a fixed plate(s). Preferably, the fixed plate is comprised of a high-temperature superconductor material. Adjacent to the fixed substrate is a movable substrate on which is a second plate comprised of either a normal metal or (for even higher Q) a high-temperature superconductor material. A filter signal voltage is coupled to the fixed and second plates that are disposed between the fixed and movable substrates and substantially parallel to one another such that the fixed and second plates define a capacitor gap(s) across which the filter signal voltage is impressed. A mechanical driver, operatively coupled to a tuning signal, is mounted on the fixed substrate and mounted to the movable substrate whereby mechanical displacements (for example, length displacements or other changes in shape) in the driver, in response to changes in the tuning signal, causes changes in the magnitude of the gap separating the movable plate and the fixed plate. Because the fixed and second plates define a capacitor, such gap alterations affect the capacitance(s), and in turn affect the functioning of the tunable filter circuit. Thus, a change in the tuning signal alters the frequency response of the tunable filter.

In a preferred embodiment, the fixed plate is split so that a first fixed plate and a second fixed plate both comprising a high-temperature superconductor material are on the fixed substrate. A floating plate, also comprising a high-temperature superconductor material is on the movable substrate. The fixed plates and the floating plates are disposed between the fixed and movable substrates so as to define a capacitor gap. Rather than coupled across the capacitor gap, the filter signal is coupled to the first and second fixed plates. Alternatively, the first and second fixed plates and the floating plate may comprise a normal metal (such as Ag) although such a substitution lowers the achievable Q.

The mechanical driver provides a robust, fast and well-controlled variation in the gaps(s) between the movable plate and the fixed plate(s) of the variable capacitor. The mechanical driver may provide relatively high forces over plate gap changes of at least a few microns (and preferably 10 microns). The mechanical driver may incorporate conventional piezoelectric or electrostrictive ceramic actuator materials such as PZT (lead zirconate titanate) which provide length displacements on the order of $10^{-3}$ (the PZT actuator changes its total length approximately 0.1% in response the tuning signal). Alternatively, the mechanical driver may incorporate newer classes of materials such as higher-performance piezoelectric ceramics or electroactive polymer materials which provide a greater achievable mechanical displacement with respect to the dimensions of the mechanical driver. In response to a tuning signal, such materials have mechanical displacements that are more complex than the simple length displacements induced in a PZT actuator. However, the geometry of the mechanical driver may be altered to allow these alternate materials to be utilized.

In a preferred embodiment, wherein the mechanical driver incorporates a length-displacement actuator material such as PZT, the mechanical driver comprises a folded piezoelectric or electrostrictive structure coupled to a tuning signal wherein a first piezoelectric driver is attached to the fixed substrate and to a coupling member. A second piezoelectric driver is also attached to the coupling member and to the movable substrate, wherein a length decrease in the first piezoelectric driver and a length increase in the second piezoelectric driver causes the capacitor gap to decrease. The tunable filter may further comprise an HTS inductor coupled between the first and second fixed plates. Preferably, the HTS inductor has an electrical length chosen to support resonance either at the HTS inductor's fundamental resonant frequency or at harmonics of the fundamental resonant frequency.

The present invention avoids intermodulation problems by the use of a mechanical driver to affect the capacitance because the masses involved in the mechanical tuning processes do not allow substantial motion of the capacitor plates to occur at the signal frequencies of interest. In addition, the present invention permits the tuning signal and the filter signal to be de-coupled, avoiding the prior art problems associated with two-terminal designs. The present invention offers an extremely high Q, driven in one embodiment by piezoelectric actuators for tuning high speed and low microphonics.

DESCRIPTION OF THE DRAWINGS

FIG. 2b is a plan view of an equivalent circuit representation of the half-wavelength resonator circuit illustrated in FIG. 2a.

DETAILED DESCRIPTION OF THE INVENTION

Figure 1A:
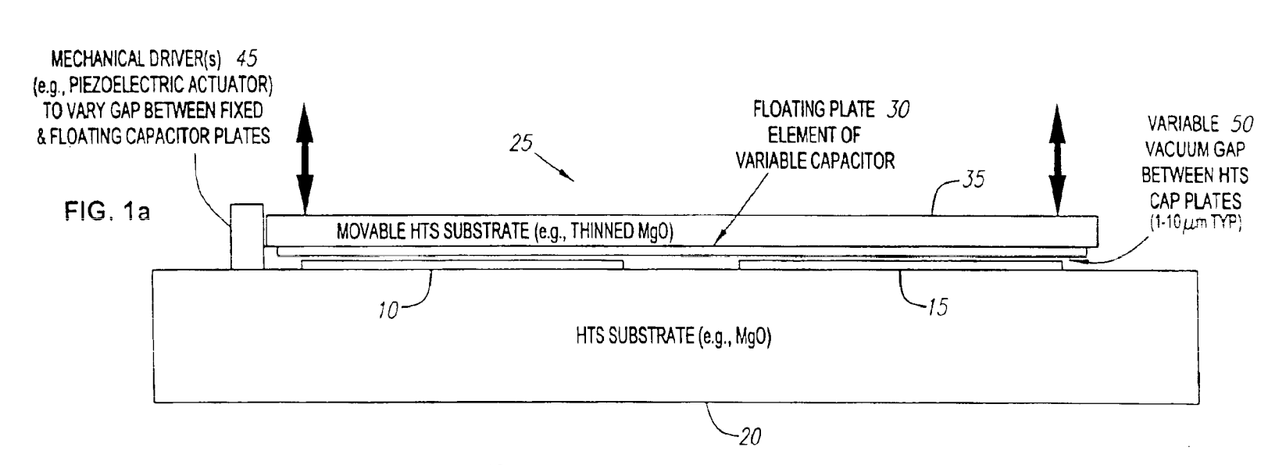
FIG. 1a is a cross section of a variable capacitor according to one embodiment of the invention.
Figure 1B:
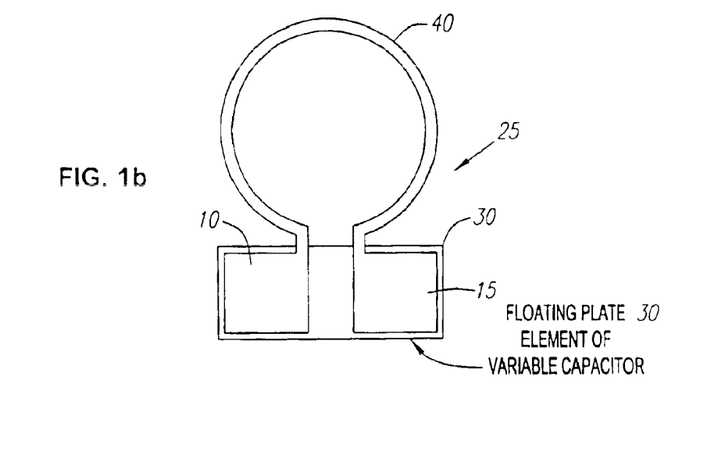
FIG. 1b is a plan view, partially cut away, of a variable capacitor structure incorporated in a resonator forming a tunable filter according to one embodiment of the invention.
Figure 1C:
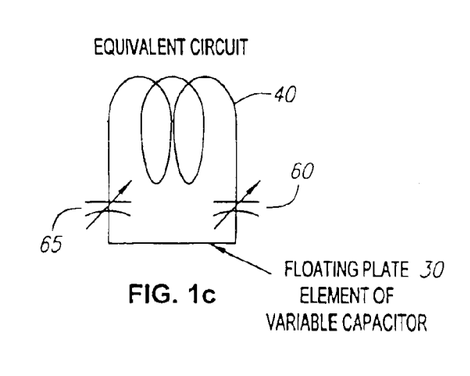
FIG. 1c illustrates an equivalent circuit of the filter resonator structure of FIG. 1b.

Turning now to FIGS. 1a and 1b, a preferred embodiment for a high-Q bandpass filter resonator based on a MEMS-like HTS split-plate variable capacitor with independent mechanical actuation is illustrated. A first fixed plate 10 and a second fixed plate 15 are patterned from thin-film HTS material (e.g., YBCO) grown on a fixed substrate 20 (see, e.g., FIG. 1a) comprising, for example, MgO. Such epitaxial superconductive thin films are now routinely formed and commercially available. See, e.g., R. B. Hammond, et al., "Epitaxial $Tl_2Ca_1Ba_2Cu_2O_8$ Thin Films With Low 9.6 GHz Surface Resistance at High Power and Above 77K," Appl. Phy. Lett., Vol. 57, pp. 825–27, 1990. The variable capacitor structure 25 is completed by the addition of a floating plate 30 (drawn transparent in the plan view in FIG. 1b) patterned from thin-film HTS material grown on a movable substrate 35 (see, e.g., FIG. 1a) comprising, for example, MgO. Floating plate 30 is spaced apart and substantially parallel to fixed plates 10 and 15 and may completely cover the fixed plates 10 and 15. As a result, the HTS variable capacitor structure 25 actually comprises two variable capacitors in series, (the equivalent circuit is illustrated in FIG. 1c) which halves the capacitance per unit area over that of a normal parallel plate structure. The advantage is that no conductive contact to floating plate 30 is required, which greatly simplifies (particularly for an HTS implementation) the achievement of very low series resistance contact to the capacitor (for high Q). In such an embodiment, a filter signal is coupled only to the fixed plates 10 and 15. A mechanical driver 45 (see, e.g., FIG. 1a), which in one embodiment is coupled between the fixed substrate 20 and the movable substrate 35, adjusts the capacitor gap 50 (see, e.g., FIG. 1a), preferably maintained in a vacuum, defined by the fixed plates 10 and 15 and the floating plate 30. Those of ordinary skill in the art will appreciate that a number of alternative mechanical drivers are suitable, e.g., piezoelectric drivers operating in various modes or drivers comprising electro-active polymer materials, provided that suitable modifications to the mechanical driver geometry are incorporated.

In this floating plate HTS variable capacitor tunable filter structure 25, wide HTS lines (potentially much wider than illustrated in the top view of FIG. 1b) may be used to define an inductor 40 (or alternatively, a transmission line segment) coupled at full width between the fixed plates 10 and 15 to achieve very high Q values. The inductor 40 may have an electrical length substantially equal to a one-half wavelength corresponding to a fundamental resonant frequency so that it becomes a simple L-C resonator circuit. Alternatively, the inductor 40 may have an electrical length substantially equal to multiples of this one-half wavelength. Moreover, the inductor 40 may be substantially shorter than one-half wavelength, thus approximating a lumped circuit element. The resulting equivalent circuit is portrayed in FIG. 1c. Two variable capacitors 60 and 65 are in series with the inductor 40. The mechanical driver 45 of FIG. 1a varies the capacitance of capacitors 60 and 65.

Figure 2A:
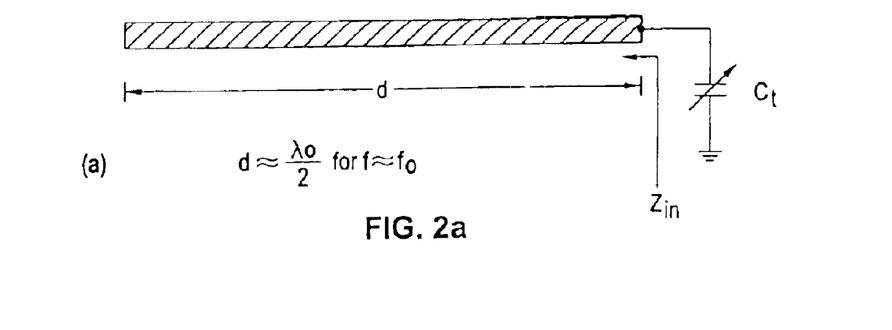
FIG. 2a is a plan view of a one-half wavelength resonator circuit.
Figure 2B:
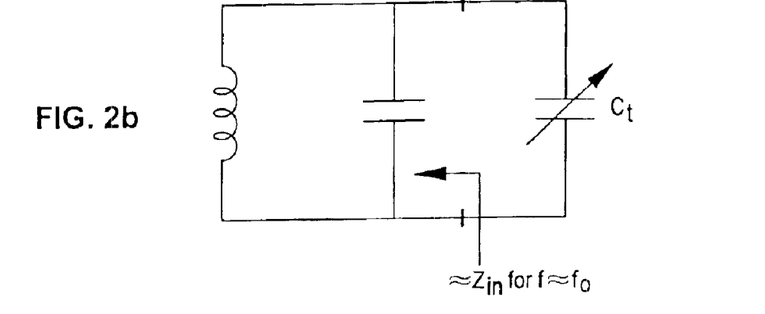

The resulting equivalent circuit as portrayed in FIG. 1c has important consequences resulting from its balanced structure. Note that a commonly used half-wavelength resonator comprises an open circuited length of microstrip transmission line as illustrated in FIG. 2a. The transmission line has a length (denoted as "d") substantially equal to one-half wavelength ($\lambda_0/2$) corresponding to the fundamental resonant frequency $f_0$. Such resonators are frequently tuned by use of a metal tuning screw through the cover plate near one end of the resonator to add capacitance between the end of the resonator and ground. Instead of a screw, one could use a variable capacitor $C_t$ as disclosed by the present invention. For frequencies at or near resonance, the impedance $Z_{in}$ seen looking into the end of the resonator matches that of a parallel tuned circuit as illustrated in 2b. For a given capacitance variation $\Delta C_t$, there will be some resulting resonant frequency variation $\Delta f_0$.

Figure 2C:
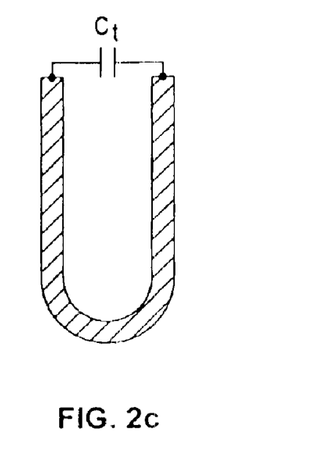
FIG. 2c is a plan view of a one-half wavelength resonator circuit.
Figure 2D:
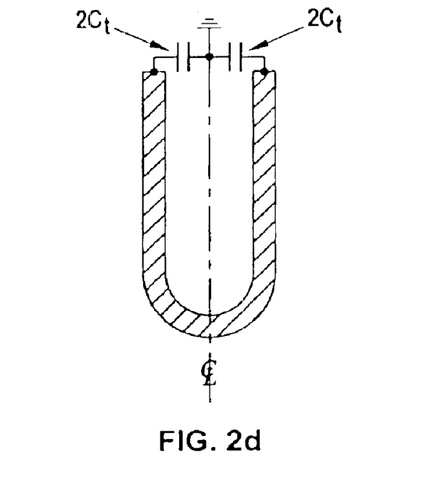
FIG. 2d is a plan view of an equivalent circuit representation of the half-wavelength resonator circuit illustrated in FIG. 2c.

Should the half-wavelength $$\left(\frac{\lambda_0}{2}\right)$$

resonator of FIG. 2a be bent into a "hairpin" configuration as shown by the inductor 40 in FIG. 1b and $C_t$ be connected across the open ends of the resonator, the balanced structure of FIG. 2c is produced. At resonance, the potentials on the two open ends of this "hairpin" resonator have opposite potential, so that the terminals of the variable capacitor are now driven in a balanced manner. Because of the balanced operation, for whatever potential that exists at a point on the right side of the hairpin, there is an equal and opposite potential at the corresponding point on the left side of the resonator. Therefore, a virtual ground will run through the centerline CL of the resonator as shown in FIG. 2d. It is then convenient to model the capacitance in the equivalent form wherein the single capacitor $C_t$ is replaced by two capacitors each having twice the capacitance of the original capacitor $C_t$. If the circuit illustrated in FIG. 2d were straightened out as in FIG. 2a, there would be a capacitor of size 2Ct at both ends of the transmission line. Thus, the capacitor Ct in FIG. 2c is four times more effective for tuning than it is in the structure illustrated in FIG. 2a.

The present invention provides a useful tunable filter possessing an extremely high Q value. The following example illustrates operation of the present invention at 9.70 GHz. Those of ordinary skill in the art will appreciate that such an example is merely illustrative of the invention and that the example is easily scaled to illustrate operation at lower or higher frequencies. As an illustration, consider a simple X-band L-C resonator of the type shown in FIG. 1a, having C=5.0 pF (actually two 10 pF capacitors in series, wherein the first and second fixed plates 10 and 15 are 0.75 mm square if the plate spacing is 5.0 $\mu$m). To give a resonant frequency of f=9.70 GHz requires an inductor 40 having a value of L=0.5384 nH, which would be produced by a loop having a nominal diameter of D=2.0 mm if its inside diameter is 1.0 mm. This results in an inductor 40 having an outside diameter of 3.0 mm and an inner hole diameter of 1.0 mm). Because the width (1 mm) of the HTS conductor forming the inductor loop 40 is nearly the same as the dimensions of the first and second fixed capacitor plates 10 and 15, the capacitor and inductor structures can be smoothly mated with little loss of Q. While, due to current crowding at the conductor edges (particularly at the edges of the hole), it is difficult to calculate the exact ac resistance, if we assume an operating frequency f=10 GHz and an HTS surface resistance of $R_S$=0.1 m$\Omega$(1×10$^{-4}$; typical for high quality YBCO at 80° K.), and then account for a 2× current crowding factor by only considering contribution from one of the two conducting HTS surfaces, the ac resistance $R_{ac}$ is given by $R_S$ (length/width)=$R_S$ ($\pi$D) (w)=0.628 m$\Omega$ for D=2 mm and w=1 mm. Therefore, at an operating frequency of 10 GHz, the calculated unloaded Q of this 2 mm diameter HTS loop inductor 40 would be Q=2 $\pi$fL/$R_{ac}$=53,840, a Q value far higher than most designs of interest require. Assuming that the loss tangent of the MgO HTS growth substrates 20 and 35 is sufficiently low and energy losses through radiation or coupling to other structures are minimal, loaded Q values of 1000 or more should be achievable, even in simple single-resonator filters having very low insertion loss.

A number of alternate geometries may be employed to construct the variable capacitor used in the present invention. For example, rather than employing the preferred "split plate" design illustrated in FIG. 1a, the first and second fixed plates 10 and 15 could be replaced with a single fixed plate (not illustrated). In such a design, however, both plates on either side of the capacitor gap 50 would require a coupling to the filter signal. In addition to alternate geometries, the floating plate 30 or the first and second fixed plates 10 and 15 may be alternatively constructed out of a normal state conductor such as gold or a similar low-loss metal rather than from HTS material. Such metals do not produce, however, Q values as high as that can be achieved using an all HTS construction.

Figure 1D:
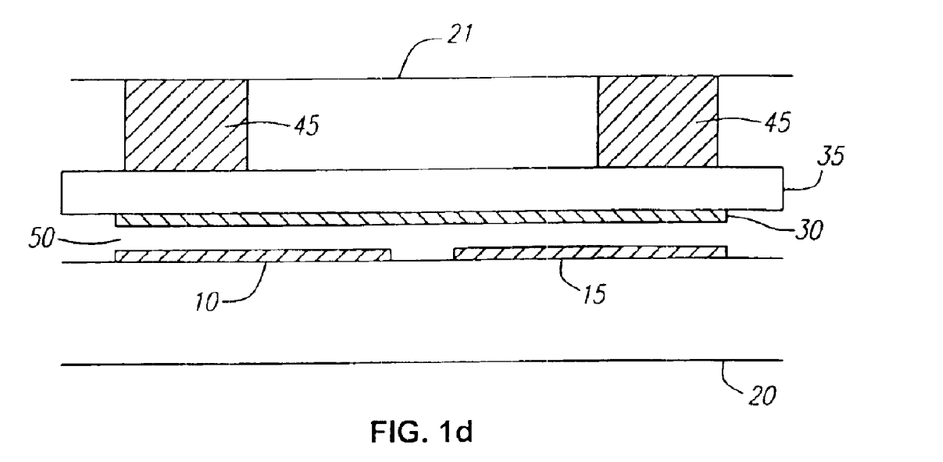
FIG. 1d is a cross section of a variable capacitor according to one embodiment of the invention.
Figure 1E:
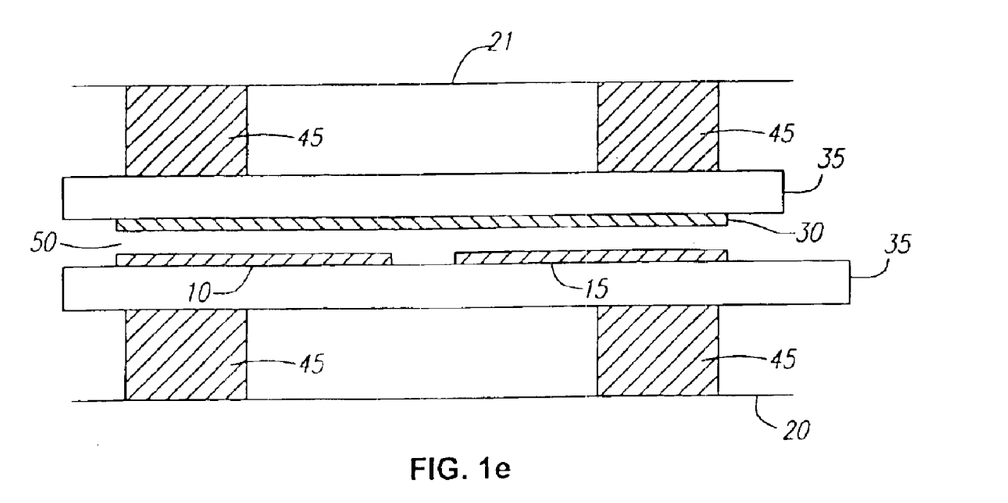
FIG. 1e is a cross section of a variable capacitor according to one embodiment of the invention.

Turning now to FIG. 1d, an embodiment of the invention is illustrated in which the movable substrate is sandwiched between two fixed substrates 20 and 21. The first and second fixed plates 10 and 15 are on the fixed substrate 20 and the floating plate 30 is on the movable substrate 35 as previously described. However, mechanical driver(s) 45 are coupled between the fixed substrate 21 and the movable substrate 35 so that the mechanical driver(s) 45 do not span across the capacitor gap 50 as did the mechanical driver 45 in the embodiment illustrated in FIG. 1a. Alternatively, turning now to FIG. 1e, the first and second "fixed" plates 10 and 15 could also be on a movable substrate 35 positioned by additional mechanical driver(s) 45 analogous to the embodiment illustrated in FIG. 1*d*.

Figure 3A:
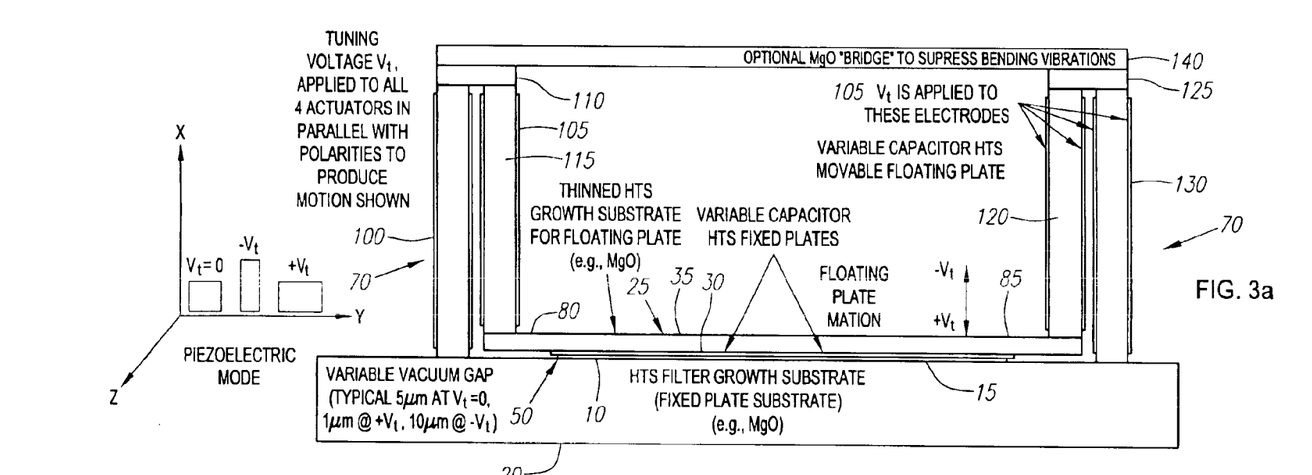
FIG. 3a is a cross section of a variable capacitor according to one embodiment of the invention.
Figure 3B:
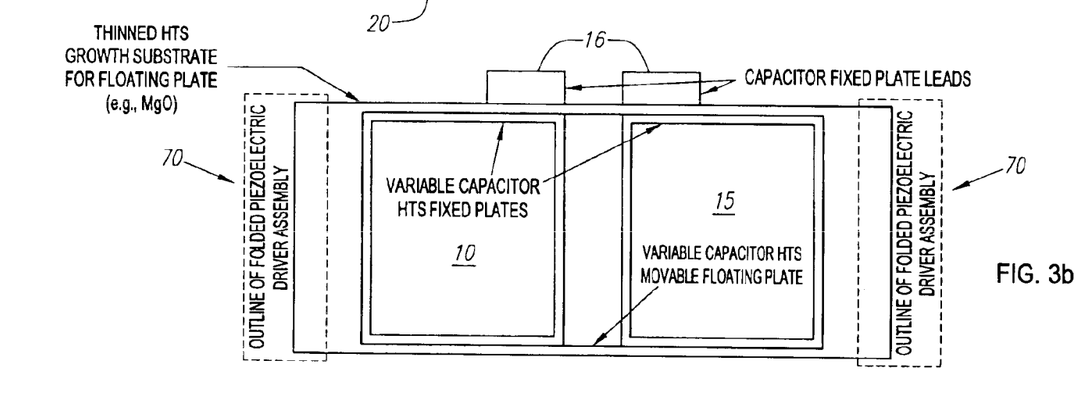
FIG. 3b is a plan view, partially cut away, of a variable capacitor structure according to one embodiment of the invention.

While the performance potential for the HTS variable capacitor tunable filters within the scope of the present invention is very exciting, the fabrication of such devices will now be addressed; specifically, how to achieve the required precise motion of the floating plate 30. A fast, stiff, robust mechanical driver 45 is very desirable. An appealing mechanical driver approach, because of its simplicity and low cost, is to use conventional piezoelectric actuators. FIGS. 3*a* and 3*b* illustrate one embodiment of the invention for implementing an HTS variable capacitor tunable filter structure 25 (see FIG. 3*a*) with piezoelectric drivers. A unique design feature shown in FIGS. 3*a* and 3*b* is the use of a "folded" piezoelectric driver 70 structure on each end of the movable substrate 35 (best seen in FIG. 3*a*). The reason for this unusual structure is that, while the stresses induced in piezoelectric materials by the application of electric fields are large, their elastic modulus is also high, so the actual attainable "dc" elongations are only of the order of $10^{-3}$ times the length of the material (higher "ac" elongations are achieved at resonance, but that is not usable for this variable capacitor application). For example, if we chose a nominal plate separation of 5 $\mu$m, variable from near zero to 10 $\mu$m with a ±5 $\mu$m range of motion, then we need at least a 5 millimeter length of piezoelectric material. By "folding" this piezoelectric material length into 2 pieces (one going up and one going down), we can keep the total height under 3 mm, and automatically cancel the effects resulting from the substantial CTE (coefficient of thermal expansion) of the piezoelectric material.

The basic structure of this embodiment of the variable capacitor HTS tunable filter 25 is similar to that already discussed with respect to FIGS 1*a* and 1*b*. As best seen in FIG. 3*a*, to accommodate the two folded piezoelectric driver structures 70 and to minimize parasitic capacitive effects between the variable capacitor HTS tunable filter 25 and the piezoelectric driver structures 70, the movable substrate has lateral extensions 80 and 85 which extend laterally substantially past fixed plates 10 and 15, respectively. The first fixed plate 10 and the second plate 15 are patterned from HTS material and grown on the fixed substrate 20 comprising, for example, MgO. An HTS material inductor 40 (not illustrated) is coupled between the first and second fixed plates 10 and 15. As previously described, this inductor 40 preferably has an electrical length chosen such that the inductor 40 behaves as a simple L-C resonator circuit. As illustrated in FIG. 3*b*, the first and second fixed plates 10 and 15 each has a lead 16 so that a filter signal may be coupled to the variable capacitor HTS tunable filter 25 (seen in FIG. 3*a*). The variable capacitor HTS tunable filter structure 25 is completed by the addition of a floating plate 30 (drawn transparent in the plan view in FIG. 3*b*) patterned from thin-film HTS material grown on the movable substrate 35 comprising, for example, MgO. As seen in FIG. 3*a*, a pair of folded piezoelectric drivers 70 is coupled to the lateral extensions 80 and 85 as follows. A first piezoelectric driver 100 is attached, using foil example, low-temperature indium alloy solder (which also may be used for the remaining required piezoelectric attachments), to the fixed substrate 20 at a location adjacent to the lateral extension 80 of movable substrate 35. The first piezoelectric driver 100 is attached at its opposite end to a coupling member 110. Also attached to coupling member 110 is the second piezoelectric driver 115. Coupling member 110 may be constructed from a suitable material such as MgO. Alternatively, coupling member 110 may simply be a low temperature indium solder bond or the like in order to couple the first and second piezoelectric drivers 100 and 115 together. The second piezoelectric driver 115 is attached at its opposite end to the lateral extension 80 of movable substrate 35, forming one of the pair of folded piezoelectric driver structures 70 wherein the first piezoelectric driver 100 and the second piezoelectric driver 115 are substantially parallel to one another. In this fashion, when the first piezoelectric driver 100 shortens and the second piezoelectric driver 115 lengthens, the gap 50 between the capacitor plates is shortened, affecting the tunable filter 25 frequency response. The other folded piezoelectric driver structure 70 is coupled to the lateral extension 85 of movable substrate 35 in an analogous fashion as follows. A third piezoelectric driver 120 is attached to lateral extension 85 at one end and attached to a coupling member 125 at its opposite end. Also attached to coupling member 125 is a fourth piezoelectric driver 130. The fourth piezoelectric driver 130 is attached at its opposite end to the fixed substrate 20 at a location adjacent to lateral extension 85 so that the third piezoelectric driver 120 and the fourth piezoelectric driver 130 are substantially parallel to one another, thereby forming the other piezoelectric driver structure 70. To suppress bending vibrations, an optional bridge 140, comprised of, e.g., MgO, may span between the coupling members 110 and 120.

In one embodiment, each piezoelectric driver is coupled to a tuning signal having a tuning signal voltage, Vt through electrodes 105. To implement the folded piezoelectric actuator structure 70, a proper combination of tuning signal voltage (Vt) polarity and the orientation of the piezoelectric material ("poling" direction) is necessary. For example, in one embodiment, with positive voltage ±Vt, the first and fourth piezoelectric drivers 100 and 130 get shorter and the second and third piezoelectric drivers 115 and 120 lengthen, driving the floating plate 30 closer toward the fixed plates 10 and 15, decreasing the gap 50 and increasing the capacitance. Analogously, in the same embodiment, a negative voltage −Vt would lengthen the first and fourth piezoelectric drivers 100 and 130 and shorten the second and third piezoelectric drivers 115 and 120. Thus, with a negative voltage −Vt, the gap 50 between the plates increases, decreasing the capacitance. The mode of piezoelectric material (typically lead ziroonate titanate, "PZT") operation is as illustrated at the lower left in FIG. 3*a*, in which a bias voltage, Vt, applied across the thin "Z" dimension of a plate causes either shortening in "X", and lengthening in "Y," or lengthening in "X" and shortening in "Y," depending on the polarity of voltage Vt. In such an embodiment, the orientation of the paired piezoelectric drivers with their respective electrodes within each folded piezoelectric driver structure may be denoted as "opposite" to each other.

Roughly analogous "opposite" paired piezoelectric driver structure (including the same piezoelectric mode and polarities) is used in standard commercial "bimorph" beam actuators. A principal difference is that in a standard bimorph beam, a thin metal (typically 5 mil stainless steel) shim fills the gap between the two PZT layers (typically 7.5 mils thick), such that when bias is applied and the PZT on one side lengthens and the PZT on the other side shortens, the beam bends. In the present invention, mechanically decoupling the two PZT drivers (except at the end attached to the coupling members 110 and 125), and preventing bending of the PZT material (by the symmetrical structure, optionally augmented by putting an MgO bridge 140 across the coupling members 110 and 125 as shown in FIG. 3*a*) leads to a Vt bias dependent change in height between the bottom ends of the piezoelectric drivers. For those not familiar with piezoelectric actuator materials and structures, the paper "Modeling of a Three-Layer Piezoelectric Bimorph Beam with Hysteresis" by T. S. Low and W. Guo, published in the Journal of Micromechanical Systems, Volume 4, No. 4 [December 1995], pages 230–237 would be a useful reference.

Referring still to the FIG. 3a, the HTS variable capacitor structure requires, at least in the vertical Referring still to FIG. 3a, the HTS variable capacitor structure requires, at least in the vertical dimension, precision mechanical fabrication and assembly. The precision fabrication is expressed principally as a flatness and peak non-planarity (bump height) specification on the facing surfaces of the fixed plates 10 and 15 and floating plate 30. To avoid short circuiting between opposing capacitor plates as the mean separation distance between the surfaces is reduced to the micron range (or even submicron range), there must not be any substantial protrusions from the facing surfaces of the plates. In one embodiment, the as-grown NTS surfaces are scanned for the presence of nodules or other "bumps" protruding from the surface and laser ablation or other techniques are employed to remove any that are too high. Note that in a capacitor plate, there is no significant performance penalty for having a few holes in the conductor film, so such a post-growth "re-figuring" of the surfaces need not be planarizing, just effective in removing "bumps" ("dips" are not a problem). The critical problem in precision assembly is establishing the correct initial (Vt=0) height (separation) and parallelism of the capacitor plates, preferably to a fraction of a micron (at least in parallelism). In one embodiment, this precision vertical alignment may be achieved by means of a self-alignment process based on an art-recognized type of removable deposited spacer technique. For example, if a 5 $\mu$m nominal spacing were desired, then a uniform 5 $\mu$m (post-develop) thick layer of photoresist could be spun onto the previously-patterned HTS fixed substrate 20 (shown as MgO in FIG. 1a) and exposed and developed to leave, for example, six "pucks," 5 $\mu$m high (one at each corner arid two along the long sides of where the movable substrate 35 will be placed. The movable stubstrate 35 may then be aligned and pressed down onto these posts while the piezoelectric drivers 70 are attached on each end with low-temperature (e.g., indium alloy) solder. After assembly is complete, the posts are dissolved away in a suitable solvent to free the floating plate 30 for unimpeded vertical motion when tuning bias voltage, Vt, is applied. (Note that the pucks may be made of photosensitive material, or other, more easily dissolved material (like poly-methyl methacrylate (PMMA)) which has been patterned using photoresist.)

Note in FIG. 3a that the thinned (for low mass When the fastest tuning rate is desired) movable substrate 35 extends considerably beyond the ends of the HTS floating plate 30 itself, forming lateral extensions 80 and 85. The reason for these substantial gaps between the floating plate 30 and the attachment points for the second and third piezoelectric drivers 115 and 120 is to minimize stray capacitance between the HTS floating plate 30 and the folded PZT driver structures 70 to avoid energy loss/Q degradation effects. Note that this piezoelectric actuator approach provides the ideal of a tuning input (the Vt electrodes on the PZT drivers) that is completely separate from the signal path; leaving a good clearance between the floating plate 30 and the PZT drivers just insures that maximum Q is realized.

To better illustrate what even a very simple tunable HTS filter of the type illustrated in FIGS. 1a, 1b, 3a, and 3b could do in a system application, an example of a simple, single-resonator, narrowband bandpass preselector filter for an X-band RADAR was considered. Those of ordinary skill in the art will appreciate that such an example is merely illustrative of the invention and that the example is easily scaled to illustrate operation at lower or higher frequencies. The $L_2$=0.5384 nH, $C_2$=0.50 pF (for $f_0$=9.70 GHz) parallel "tank" resonator (the dimensions and projected unloaded Q of which were discussed above) was considered with simple inductive loop coupling to a 50 ohm source and a 50 ohm load was considered. Analysis of the circuit was performed both analytically and using simulated program with integrated circuit emphasis (SPICE) (the two approaches give the same result). Since the unloaded Q of the resonator (approximately 50,000 as calculated previously) is so much higher than the intended loaded Q (a bandwidth of 20 MHz [full width at half maximum (FWHM)] at $f_0$=10 GHz would be appropriate for a RADAR application, corresponding to a loaded Q=$f_0/\Delta f$=500), the ac resistance $R_{ac}$ of the $L_2$-$C_2$ resonator was ignored. The bandwidth of this simple loop-coupled single resonator tunable bandpass filter is determined by the inductance of the input and output coupling loops ($L_1$ and $L_3$, both taken as 20% of $L_2$) and their coupling coefficients ($K_{12}$ and $K_{23}$, both taken as 0.09) to the resonator inductor, $L_2$. These particular values were selected to give a −3 dB bandwidth of 20 MHz. Note that in the physical construction of such an HTS filter, it is not necessary that these input and output coupling loops be made of HTS material, or even lie on the cooled HTS substrate. It would be easier to have them lie well above and below the resonator substrate (to minimize direct coupling between them, and to have their positions mechanically adjustable when the filter is setup to select the exact bandwidth desired. Note that placing these input and output loops out of contact with the cooled HTS substrate avoids the thermal conduction load associated with metallic conductors to the substrate. (This advantage would apply equally well to capacitive probe coupling to the resonator, which is another satisfactory means of making a resonator into a bandpass filter).

Figure 4:
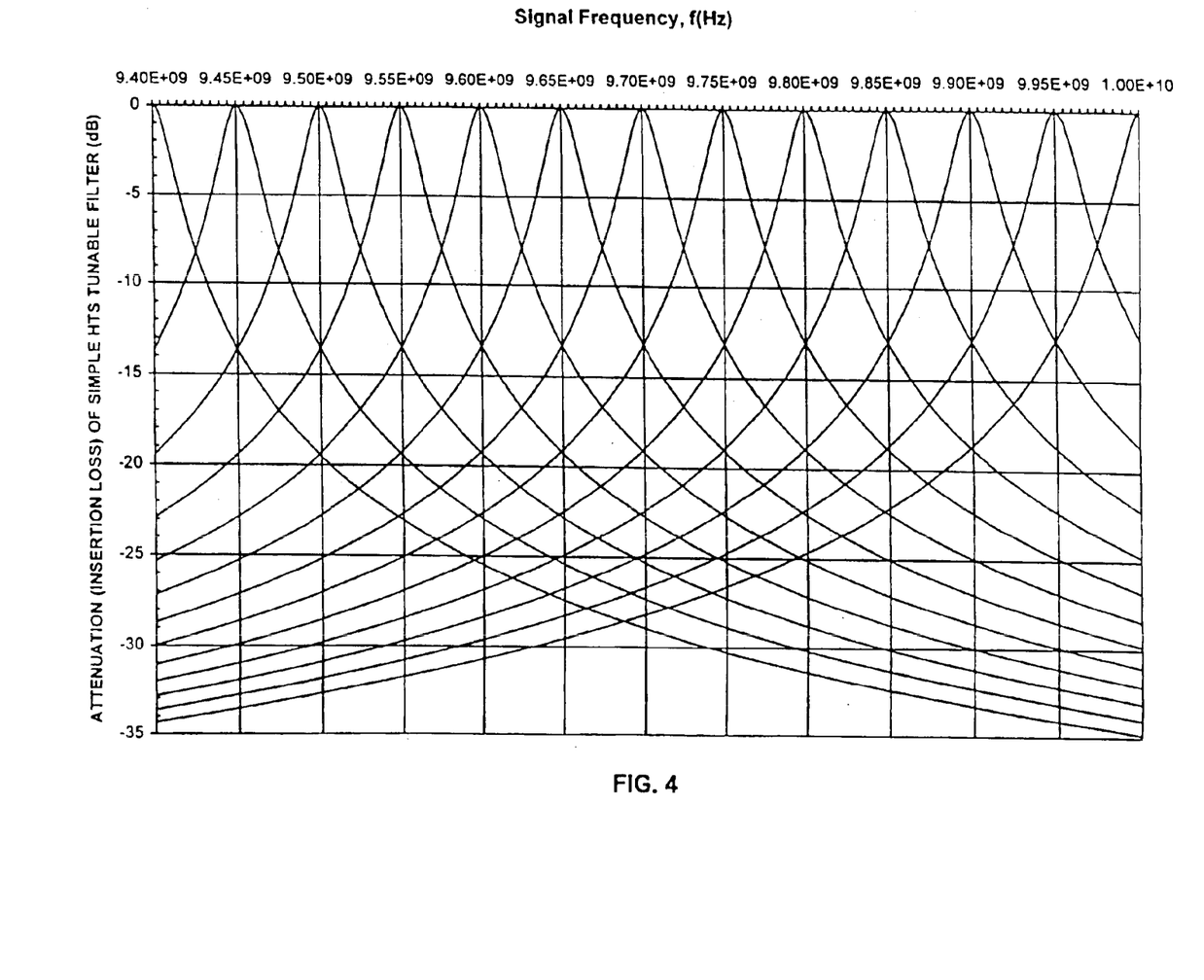
FIG. 4 is a graph relating the insertion loss vs. frequency relationship in a loop-coupled single-resonator tunable filter according to one embodiment of the invention.
Figure 5:
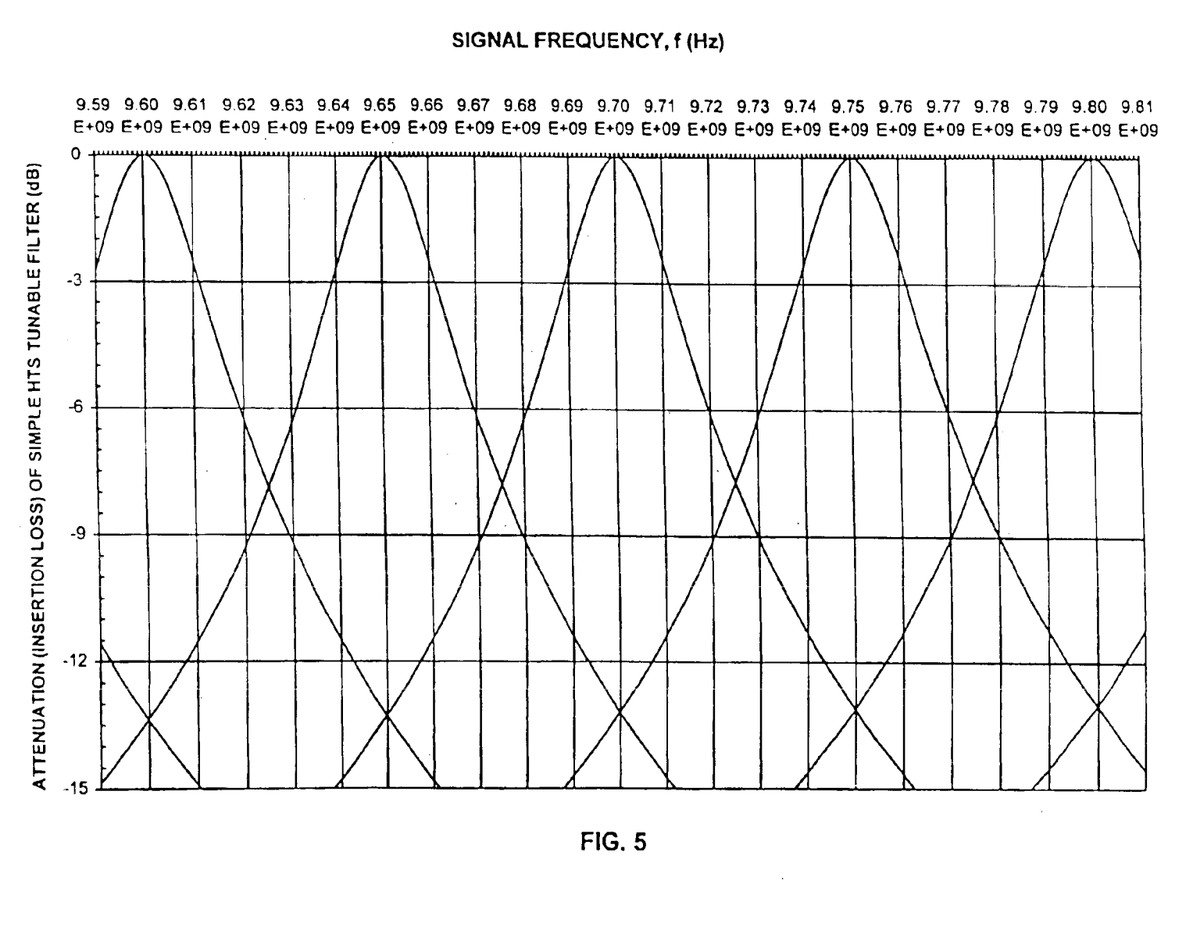
FIG. 5 is a graph relating the insertion loss vs. frequency in a loop-coupled single-resonator tunable filter according to one embodiment of the invention.

FIG. 4 shows a series of insertion loss vs. frequency curves over a 0 to −35 dB insertion loss and a 9.40 GHz to 10.0 GHz frequency range. The inductance values and coupling coefficients are the same for all curves; only the value of the variable capacitor, $C_2$, is changed. The curves are plotted for nominal (unloaded) $L_2$-$C_2$ resonant frequencies of 9.40 GHz, 9.45 GHz, 9.50 GHz . . . to 10.0 GHz. ($L_2$=0.538427 nH for all curves, with $C_2$ calculated from the equation $C_2$=(2 $\pi f_0)^2 L_2$. The same data is plotted in more detail over a 0 to −15 dB insertion loss range over a more limited 9.59 GHz to 9.81 GHz frequency range (10 MHz per major division) in FIG. 5. We see in FIG. 5 that the −3 dB bandwidth is indeed 20 MHz ($f_{-3\ db}$=$f_0$±10 MHz) at $f_0$=9.7 GHz. While the bandwidth changes as the center frequency, $f_0$, is changed (increasing or decreasing in proportion to $f_0$) the change over the X-band frequencies of interest (FIG. 4) is not very large. Given a 10:1 plate separation range (e.g., 1 $\mu$m to 10 $\mu$m), the achievable capacitance tuning range (including fringe capacitance) should be at least 9:1, which would imply a 3:1 frequency tuning range. The insertion loss of the filter is negligible, due to the high unloaded Q of the HTS tunable resonator. Of course, with only a single resonator, for a given bandwidth, the rejection outside of this passband is limited to −20 dB to −40 dB (depending on frequency difference from passband center frequency to interferer). Considering that the purpose of a RADAR preselection filter is not to define the bandwidth, just to push down the amplitude of interfering signals or jammers in order to reduce intermodulation or de-sensitization effects on system performance, this level of out of band rejection would be fine. Of course, much higher out of band performance (as well as flatter in-band response) could be achieved by making use of multiple tunable resonator assemblies coupled together (using standard filter design technology) in a tunable filter having many more poles.

For radio frequency and microwave applications the present invention offers outstanding performance (unloaded Q, tuning range, etc.) There is some question of whether the tuning speed, using only conventional PZT materials, can be brought down to the 5 µs to 10 µs range that would be desirable for frequency-hopping applications (unless operation with very small gaps proves feasible, although the use of higher performance ceramic piezoelectric or electroactive polymer materials should make this possible). However, the filters themselves are quite small, and so there would be little penalty to putting two of these filters in a cryocooler vacuum dewar and "ping-ponging" back and forth between them on successive hops. Thus, with a hopping residence time of a few milliseconds, there would be plenty of time to tune the "off duty" filter to the next hop frequency. In fact, even if undesirable piezoelectric driver hysteresis or drift characteristics prevent obtaining precise "first-shot" open-loop tuning, there should be ample time to check the new set frequency of the "off-duty" filter and correct it if necessary. Of course, in a preferred embodiment, the present invention will use the finest available "atomic force microscopy (AFM) quality" piezoelectric actuator technology to achieve fast, open-loop operation in the simplest way possible.

Figure 6A:
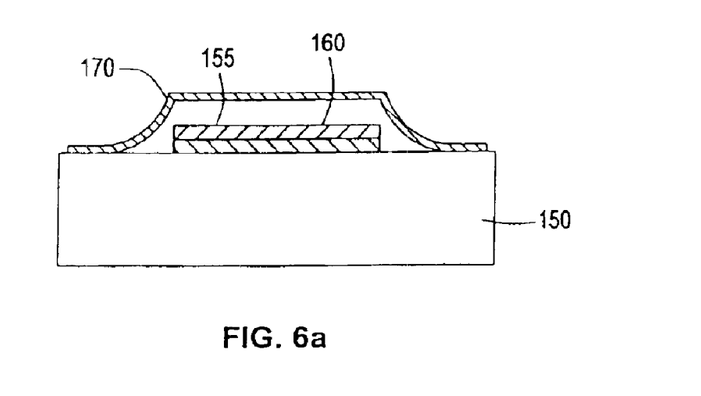
FIG. 6a is a cross section of an electrostatic-actuated capacitor in its low capacitance state.
Figure 6B:
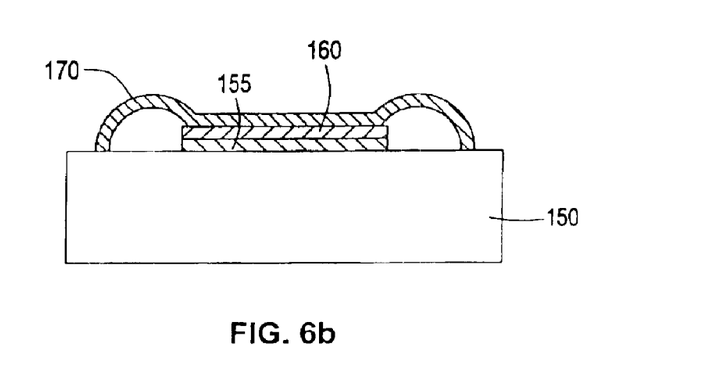
FIG. 6b is a cross section of an electrostatic-actuated capacitor in its high capacitance state.

While FIGS. 3a and 3b illustrate a piezoelectrically-actuated form of the microelectromechanical (MEMS) continuously-variable capacitor structure, the present invention includes other means of actuating a variable capacitor structure. For example, FIGS. 6a and 6b illustrate an electrostatically-actuated form of MEMS capacitor structure capable of switching between a high and a low capacitance state. The switched capacitor is formed on a substrate 150 (comprised of, for example, quartz) upon which is deposited a metal electrode 155. The electrode 155 is sandwiched between the substrate 150 and a dielectric layer 160. A flexible metal membrane 170 is formed or biased so as to be spaced apart from the dielectric layer 160, thus forming a low capacitance state as illustrated in FIG. 6a. When a suitable electrostatic potential is applied across the electrode 155 and membrane 170, the flexible membrane 170 deflects against the dielectric layer, inducing a high capacitance state as illustrated in FIG. 6b. Preferably, both the flexible metal membrane 170 and the electrode 155 are formed from gold or a suitable low loss metal and are cryogenically cooled during operation. During such cryogenic operation, the switched capacitor is expected to have a Q of 20,000 at a frequency of 1 GHz.

Figure 6C:
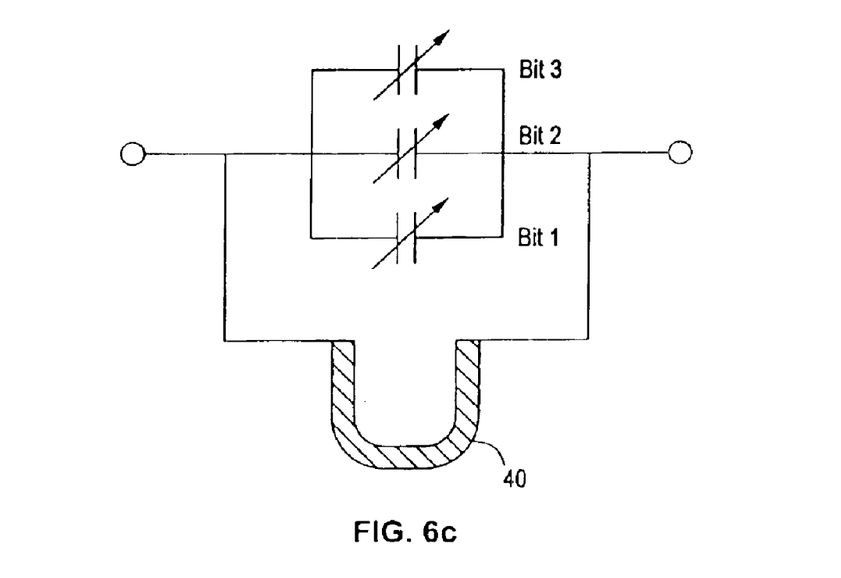
FIG. 6c is plan view of a digitally tunable HTS filter.

Consider an array of N such switched capacitors arranged in parallel, wherein N is an integer. The capacitors could be formed so that a first capacitor would have a given capacitance value, a second capacitor would have twice the capacitance value of the first and so on. A control circuit would determine the amount of capacitance required to, for example, tune a tunable HTS filter and generate a digital command signal corresponding to the required capacitance. A decoder would switch one or more of the switched capacitors in response to the digital command signal. Thus, the array would form a binary sequence with the first capacitor corresponding to bit one of the digital command signal, the second capacitor corresponding to bit two of the digital command signal and so on. Such a capacitor array, showing bit one, bit two, and bit three, is illustrated in FIG. 6c. An HTS resonator 40 would be coupled across the array in order to complete the tunable filter. The resonator 40 may have an electrical length substantially equal to a half-wavelength corresponding to the fundamental resonant frequency of the resonator 40 or it may have an electrical length substantially equal to multiples of this half-wavelength. Tuning is accomplished in discrete steps (digital tuning) with a granularity that depends on the number of bits in the sequence.

The above detailed description and the accompanying drawings are intended to illustrate specific embodiments of the present invention and are not intended to limit the scope of the present invention. Those of ordinary skill in the art will recognize that various modifications of the above-described embodiments are possible without departing from the spirit of the invention. Therefore, the scope of the present invention is defined by the following claims.

What is claimed is:

1. A tunable filter comprising:

a fixed substrate having an upper surface;

a first plate on the upper surface of said fixed substrate;

a movable substrate having a lower surface opposing the upper surface of the fixed substrate;

a second plate on the lower surface of the movable substrate, wherein the first plate and second plate define a capacitor having a capacitor gap, wherein the capacitor gap is maintained in a vacuum; and a driver having a first end and a second end, wherein the first end of the driver is mounted directly on the fixed substrate and the second end of the driver is attached to the movable substrate, and wherein a length change of the driver changes the capacitor gap, thereby affecting a frequency response of said tunable filter.

2. The tunable filter of claim 1, wherein the movable substrate comprises MgO.

3. The tunable filter of claim 1, wherein the first plate comprises a high temperature superconductor.

4. The tunable filter of claim 1, wherein the second plate comprises a high temperature superconductor.

5. The tunable filter of claim 1, wherein the movable substrate comprises MgO, the first plate comprises a high temperature superconductor, and the second plate comprises a high temperature superconductor.

6. A tunable filter comprising:

a fixed substrate having an upper surface;

a first plate on the upper surface of the fixed substrate;

a second plate on the upper surface of the fixed substrate;

a movable substrate having a lower surface opposing the upper surface of the fixed substrate;

a floating plate on the lower surface of the movable substrate, wherein the first plate, the second plate and the floating plate define a capacitor having a capacitor gap, wherein the capacitor gap is maintained in a vacuum; and a driver having a first end and a second end, wherein the first end of the driver is mounted directly on the fixed substrate and the second end of the driver is attached to the movable substrate, and wherein a length change of the driver changes the capacitor gap, thereby affecting a frequency response of said tunable filter.

7. The tunable filter of claim 6, wherein the movable substrate comprises MgO.

8. The tunable filter of claim 6, wherein the first and second plates comprise a high temperature superconductor.

9. The tunable filter of claim 6, wherein the floating plate comprises a high temperature superconductor.

10. The tunable filter of claim 6, wherein each of the first plate, second plate, and floating plate comprises a high temperature superconductor.

11. The tunable filter of claim 6, wherein the first and second plates comprise a low-loss metal.

12. The tunable filter of claim 6, wherein the floating plate comprises a low-loss metal.

13. The tunable filter of claim 6, further comprising an inductor coupled to the first plate and the second plate.

* * * * *